(12) United States Patent
Priewasser

(10) Patent No.: US 9,905,453 B2
(45) Date of Patent: Feb. 27, 2018

(54) PROTECTIVE SHEETING FOR USE IN PROCESSING A SEMICONDUCTOR-SIZED WAFER AND SEMICONDUCTOR-SIZED WAFER PROCESSING METHOD

(71) Applicant: Karl Heinz Priewasser, Munich (DE)

(72) Inventor: Karl Heinz Priewasser, Munich (DE)

(73) Assignee: DISCO Corporation, Tokyo (JP)

( * ) Notice: Subject to any disclaimer, the term of this patent is extended or adjusted under 35 U.S.C. 154(b) by 0 days.

(21) Appl. No.: 15/540,165

(22) PCT Filed: Dec. 29, 2014

(86) PCT No.: PCT/EP2014/079367
§ 371 (c)(1),
(2) Date: Jun. 27, 2017

(87) PCT Pub. No.: WO2016/107630
PCT Pub. Date: Jul. 7, 2016

(65) Prior Publication Data
US 2018/0005862 A1   Jan. 4, 2018

(51) Int. Cl.
*H01L 21/683* (2006.01)
*H01L 21/78* (2006.01)
(Continued)

(52) U.S. Cl.
CPC ........ *H01L 21/6836* (2013.01); *H01L 21/268* (2013.01); *H01L 21/304* (2013.01);
(Continued)

(58) Field of Classification Search
USPC ........................................ 438/463
See application file for complete search history.

(56) References Cited

U.S. PATENT DOCUMENTS 9,112,050 B1 * 8/2015 Lei .......................... H01L 21/82
9,159,621 B1 * 10/2015 Lei .......................... H01L 21/78

FOREIGN PATENT DOCUMENTS

EP        0715341      *  5/1996
EP        0 715 341 A1    6/1996
(Continued)

OTHER PUBLICATIONS

Int'l. Search Report issued in Int'l. App. No. PCT/EP2014/079367, dated Sep. 2, 2015.

*Primary Examiner* — Marcos D Pizarro
*Assistant Examiner* — Lawrence Tynes, Jr.
(74) *Attorney, Agent, or Firm* — Greer Burns & Crain Ltd.

(57) ABSTRACT

A protective sheeting for use in processing a semiconductor-sized wafer has a substantially circular base sheet and a substantially annular adhesive layer applied to a peripheral portion of a first surface of the base sheet. The inner diameter of the adhesive layer is smaller than the diameter of the wafer. Further, the outer diameter of the adhesive layer is larger than the inner diameter of an annular frame for holding the wafer. A related method includes attaching the protective sheeting to a front side or a back side of the wafer via the adhesive layer on the first surface of the base sheet so that an inner peripheral portion of the adhesive layer adheres to an outer peripheral portion of the front side or the back side of the wafer, and processing the wafer after the protective sheeting has been attached to the front side or the back side thereof.

20 Claims, 7 Drawing Sheets

(51) Int. Cl.
*H01L 21/268* (2006.01)
*H01L 21/304* (2006.01)
*H01L 21/67* (2006.01)
*B81C 1/00* (2006.01)

(52) U.S. Cl.
CPC ........ *H01L 21/67132* (2013.01); *H01L 21/78* (2013.01); *B81C 1/00896* (2013.01); *H01L 2221/6834* (2013.01); *H01L 2221/68327* (2013.01); *H01L 2221/68386* (2013.01)

(56) References Cited

FOREIGN PATENT DOCUMENTS

| | | | |
|---|---|---|---|
| JP | 2009-246195 | A | 10/2009 |
| JP | 2009246195 | * | 10/2009 |
| JP | 2013-243310 | A | 12/2013 |
| JP | 2013243310 | * | 12/2013 |

* cited by examiner (a)

(b)

(c)

PROTECTIVE SHEETING FOR USE IN PROCESSING A SEMICONDUCTOR-SIZED WAFER AND SEMICONDUCTOR-SIZED WAFER PROCESSING METHOD

This is a National Phase Application filed under 35 U.S.C. § 371, of International Application No. PCT/EP2014/079367, filed Dec. 29, 2014, the contents of which are incorporated by reference.

TECHNICAL FIELD

The invention relates to a protective sheeting, such as a protective tape, for use in processing a semiconductor-sized wafer, such as a semiconductor wafer, e.g., a Si wafer. Further, the invention relates to a semiconductor-sized wafer processing method using such a protective sheeting.

TECHNICAL BACKGROUND

In conventional semiconductor-sized wafer processing methods, the wafer to be processed is commonly attached to an annular frame via a tape. The attachment of the wafer to the annular frame facilitates handling of the wafer in subsequent processing steps, such as grinding, cutting, dicing, e.g., blade dicing or laser dicing, or polishing.

A wafer, such as a semiconductor wafer, may have a plurality of devices, such as ICs (Integrated Circuits), LSIs ("Large Scale Integration") or MEMS (Micro Electro Mechanical Systems), formed on the front side thereof. These devices are arranged on the front side of the wafer in separate regions which are partitioned by a plurality of crossing or intersecting division lines (also called "streets"). The wafer is divided along these division lines, in order to obtain a plurality of individual device chips.

In order to protect the devices formed on the wafer, e.g., from contamination by debris or cutting water, a protective tape or sheeting may be applied to the front side of the wafer prior to the cutting or dicing process. However, in particular, for the case of sensitive devices, such as MEMS, there is a problem in that the device structure on the wafer may be damaged by the adhesive force of an adhesive layer formed on the protective tape or sheeting or may be contaminated by adhesive residues on the devices, when the tape or sheeting is peeled off from the wafer.

In order to overcome the above-identified problem, a wafer processing method has been proposed in U.S. Pat. No. 8,815,644 B2 in which a ring adhesive tape having an annular adhesive layer only in a peripheral area thereof is attached to the front side of the wafer. The annular adhesive layer of the ring adhesive tape is positioned so as to correspond to a peripheral marginal area of the wafer in which no devices are formed. In this way, any damage or contamination of devices formed in a device area of the wafer due to the adhesive layer can be prevented.

According to the wafer processing method disclosed in U.S. Pat. No. 8,815,644 B2, the wafer having the ring adhesive tape attached thereto is subjected to a back side grinding step, while holding the wafer on a chuck table. Subsequently, the ring adhesive tape attached to the front side of the wafer is attached to a support tape which is held by an annular frame. By means of the support tape, the wafer is held on another chuck table and modified layers are formed inside the wafer by applying a suitable laser beam from the back side thereof.

The wafer processing method discussed above thus requires the use of at least two different tapes, namely the ring adhesive tape and the support tape. In a first step, the ring adhesive tape has to be aligned with the wafer to be processed and, in a second step, the wafer with the ring adhesive tape attached thereto has to be aligned with the support tape.

Hence, there remains a need for a protective sheeting or tape for use in semiconductor-sized wafer processing which allows for the processing operation to be simplified, reducing both the number of processing equipment components required and the number of processing steps.

SUMMARY OF THE INVENTION

One object of the invention is to provide a protective sheeting for use in processing a semiconductor-sized wafer which allows for the number of processing equipment components and the number of processing steps to be reduced, thereby simplifying the wafer processing operation. Further, the invention aims to provide a semiconductor-sized wafer processing method using such a protective sheeting. These goals are achieved by a protective sheeting with the technical features of claim 1 and a semiconductor-sized wafer processing method with the features of claim 12. Preferred embodiments of the invention follow from the dependent claims.

The invention provides a protective sheeting, such as a protective tape, for use in processing a semiconductor-sized wafer, e.g., a semiconductor wafer. The protective sheeting comprises a substantially circular or circular base sheet and a substantially annular or annular adhesive layer applied to a peripheral portion or circumference portion of a first surface of the base sheet. The substantially annular or annular adhesive layer has an inner diameter and an outer diameter. The inner diameter of the adhesive layer is smaller than the diameter of the semiconductor-sized wafer. The outer diameter of the adhesive layer is larger than the inner diameter of a semiconductor-sized annular frame for holding the semiconductor-sized wafer.

The semiconductor-sized annular frame for holding the semiconductor-sized wafer has the inner diameter and an outer diameter. The frame for holding the wafer may be a substantially annular frame.

The substantially circular or circular base sheet is a continuous base sheet. The base sheet is continuously formed of a base sheet material without any interruptions.

Inside the inner diameter of the adhesive layer, no adhesive is provided on the first surface of the base sheet. Further, outside the outer diameter of the adhesive layer, no adhesive is provided on the first surface of the base sheet.

Herein, the term "substantially circular" defines a shape whose peripheral or circumferential form may deviate from a perfect circle, e.g., due to the provision of one or more flat or straight portions, notches and/or grooves. The substantially circular shape of the base sheet may correspond to the peripheral or circumferential shape of the semiconductor-sized wafer. The outer circumference of the semiconductor-sized wafer may have one or more flat or straight portions. The outer circumference of the wafer may have a notch or groove, for example, for indicating the crystal orientation of the wafer.

Herein, the term "substantially annular" defines that the shape of the adhesive layer may deviate from a perfect annulus, e.g., due to the presence of one or more flat or straight portions, notches and/or grooves. The inner peripheral or circumferential shape of the adhesive layer may correspond to the outer peripheral or circumferential shape of the semiconductor-sized wafer.

The outer diameter of the substantially annular or annular adhesive layer is larger than the diameter of the semiconductor-sized wafer. The outer diameter of the substantially annular or annular adhesive layer may be smaller than the outer diameter of the annular frame.

Herein, the term "semiconductor-sized" wafer refers to a wafer with the dimensions (standardised dimensions), in particular, the diameter (standardised diameter), i.e., outer diameter, of a semiconductor wafer.

The dimensions, in particular, the diameters, i.e., outer diameters, of semiconductor wafers are defined in the SEMI standards. For example, the semiconductor-sized wafer may be a Si wafer. The dimensions of polished single crystal Si wafers are defined in the SEMI standards M1 and M76. The semiconductor-sized wafer may be a 3 inch, 4 inch, 5 inch, 6 inch, 8 inch, 12 inch or 18 inch wafer.

Herein, the term "semiconductor-sized" annular frame refers to an annular frame with the dimensions (standardised dimensions), in particular, the inner diameter (standardised inner diameter), of an annular frame for holding a semiconductor wafer.

The dimensions, in particular, the inner diameters, of annular frames for holding semiconductor wafers are also defined in the SEMI standards. For example, the dimensions of tape frames for 300 mm wafers are defined in SEMI standard SEMI G74 and the dimensions of plastic tape frames for 300 mm wafers are defined in SEMI standard SEMI G87. The annular frames may have frame sizes for holding semiconductor-sized wafers with sizes of, for example, 3 inch, 4 inch, 5 inch, 6 inch, 8 inch, 12 inch or 18 inch.

The semiconductor-sized wafer may be, for example, a semiconductor wafer, a glass wafer, a sapphire wafer, a ceramic wafer, such as an alumina ($Al_2O_3$) ceramic wafer, a quartz wafer, a zirconia wafer, a PZT (lead zirconate titanate) wafer, a polycarbonate wafer, a metal (e.g., copper, iron, stainless steel, aluminium or the like) or metalised material wafer, a ferrite wafer, an optical crystal material wafer, a resin, e.g., epoxy resin, coated or molded wafer or the like.

In particular, the semiconductor-sized wafer may be, for example, a Si wafer, a GaAs wafer, a GaN wafer, a GaP wafer, an InAs wafer, an InP wafer, a SiC wafer, a SiN wafer, a LT (lithium tantalate) wafer, a LN (lithium niobate) wafer or the like.

The semiconductor-sized wafer may be made of a single material or of a combination of different materials, e.g., two or more of the above-identified materials. For example, the semiconductor-sized wafer may be a Si and glass bonded wafer, in which a wafer element made of Si is bonded to a wafer element made of glass.

The base sheet may have a thickness in the range of 20 to 300 µm. The adhesive layer on the first surface of the base sheet may have a thickness in the range of 5 to 200 µm.

The inner diameter of the substantially annular or annular adhesive layer is smaller than the diameter of the semiconductor-sized wafer. Thus, the protective sheeting can be attached to a front side or a back side of the wafer via the adhesive layer so that an inner peripheral portion of the adhesive layer adheres to an outer peripheral portion of the front side or the back side of the wafer. In this way, the wafer can be securely held by the protective sheeting. The adhesive layer is a substantially annular or annular adhesive layer, i.e., no adhesive is provided on the first surface of the base sheet inside the inner diameter of the adhesive layer. Hence, any possible damage or contamination of devices formed on the wafer due to an adhesive force of the adhesive layer or adhesive residues on the devices can be minimised.

Further, the outer diameter of the adhesive layer is larger than the inner diameter of the semiconductor-sized annular frame for holding the semiconductor-sized wafer. The protective sheeting can thus be attached to the annular frame via the adhesive layer so that an outer peripheral portion of the adhesive layer adheres to an inner peripheral portion of the annular frame. In this way, a central opening of the annular frame, i.e., the area inside the inner diameter of the annular frame, can be closed by the protective sheeting. Thus, the protective sheeting can be securely attached to the annular frame.

Hence, a single protective sheeting can be used for both holding and protecting the wafer and attaching the wafer to the annular frame, thus reducing the number of necessary equipment components and processing steps.

As has been indicated above, the wafer, such as a semiconductor wafer, may have a plurality of devices, such as ICs, LSIs and/or MEMS, formed on the front side thereof. These devices may be arranged in a device area where, for example, the devices may be respectively formed in a plurality of regions partitioned by intersecting or crossing division lines. The wafer may further have a peripheral marginal area or edge exclusion surrounding the device area, in which no devices are formed.

The adhesive layer on the first surface of the base sheet may be arranged so that it does not extend into the device area on the front side of the wafer. The inner diameter of the adhesive layer may be substantially the same as or larger than the outer diameter of the device area of the wafer.

In this way, any damage or contamination of the devices formed in the device area can be particularly reliably prevented.

The diameter of the base sheet may be substantially the same as the outer diameter of the adhesive layer. In this way, a particularly efficient use of resources can be ensured.

The inner diameter of the adhesive layer may be smaller than the diameter of the wafer by 0.5 to 3.5 mm, preferably by 1.0 to 3.0 mm and more preferably by 1.5 to 2.5 mm. The peripheral marginal area or edge exclusion of a wafer, in which no devices are formed, commonly has a width of about 2 to 3 mm from the wafer edge. Thus, by choosing the inner diameter of the adhesive layer as specified above, it can be ensured that the adhesive layer does not interfere with the devices formed on the wafer.

The outer diameter of the adhesive layer may be in the range from 105 to 575 mm. The inner diameter of the adhesive layer may be in the range from 45 to 445 mm.

The outer diameter of the adhesive layer may be larger than the inner diameter of the adhesive layer by 30 to 100 mm, preferably by 40 to 70 mm. In this way, the protective sheeting can be attached particularly reliably to both the wafer and the annular frame.

The base sheet may be formed of a single material or of a combination of different materials. For example, the base sheet may be formed of polyvinyl chloride (PVC), polyolefin (PO), polyethylene terephthalate (PET), Kapton or the like or of a combination of two or more of these materials. These materials allow for the protective sheeting to be provided in a robust and lightweight form.

An additional substantially annular or annular adhesive layer may be applied to a peripheral portion of a second surface of the base sheet, opposite to the first surface. The adhesive layer on the second surface of the base sheet may be formed from the same adhesive as the adhesive layer on the first surface of the base sheet or from a different adhesive.

Alternatively, the second surface of the base sheet opposite to the first surface of the base sheet may be fully coated with another adhesive layer. The adhesive layer on the second surface of the base sheet may be formed from the same adhesive as the adhesive layer on the first surface of the base sheet or from a different adhesive.

The adhesive layer on the second surface of the base sheet may have a thickness in the range of 5 to 200 µm.

Such protective sheetings having another substantially annular or annular adhesive layer or a fully coated adhesive layer on the second surface of the base sheet may be comprised in a protective sheeting arrangement with two release liners, as will be further detailed below. In this case, the protective sheetings are attached to the one release liner via the adhesive layer on the first surface of the base sheet and to the other release liner via the adhesive layer on the second surface of the base sheet.

The provision of another substantially annular or annular adhesive layer or a fully coated adhesive layer on the second surface of the base sheet allows for the protective sheeting to be attached also to a carrier, such as a rigid substrate, for example, a glass or silicon substrate.

The outer diameter of the substantially annular or annular adhesive layer on the second surface of the base sheet may be substantially the same as the diameter, i.e., the outer diameter, of the carrier. The inner diameter of the substantially annular or annular adhesive layer on the second surface of the base sheet may be substantially the same as or larger than the diameter, i.e., the outer diameter, of a device area of a wafer to which the protective sheeting is attached.

The outer diameter of the substantially annular or annular adhesive layer on the first surface of the base sheet may be substantially the same as the outer diameter of the substantially annular or annular adhesive layer on the second surface of the base sheet. The outer diameter of the substantially annular or annular adhesive layer on the first surface of the base sheet may be larger or smaller than the outer diameter of the substantially annular or annular adhesive layer on the second surface of the base sheet.

The inner diameter of the substantially annular or annular adhesive layer on the first surface of the base sheet may be substantially the same as the inner diameter of the substantially annular or annular adhesive layer on the second surface of the base sheet. The inner diameter of the substantially annular or annular adhesive layer on the first surface of the base sheet may be larger or smaller than the inner diameter of the substantially annular or annular adhesive layer on the second surface of the base sheet.

For example, a protective sheeting with substantially annular or annular adhesive layers on the first and second surfaces of the base sheet may be used to attach a semiconductor-sized wafer to a glass or silicon substrate for providing further support to the wafer, e.g., when processing the wafer by grinding, cutting, dicing or the like.

The diameter, i.e., the outer diameter of the fully coated adhesive layer on the second surface of the base sheet may be substantially the same as the diameter, i.e., the outer diameter, of the carrier.

The outer diameter of the substantially annular or annular adhesive layer on the first surface of the base sheet may be substantially the same as the outer diameter of the fully coated adhesive layer on the second surface of the base sheet. The outer diameter of the substantially annular or annular adhesive layer on the first surface of the base sheet may be larger or smaller than the outer diameter of the fully coated adhesive layer on the second surface of the base sheet.

The inner diameter of the substantially annular or annular adhesive layer on the first surface of the base sheet may be substantially the same as the outer diameter of the fully coated adhesive layer on the second surface of the base sheet. The inner diameter of the substantially annular or annular adhesive layer on the first surface of the base sheet may be larger or smaller than the outer diameter of the fully coated adhesive layer on the second surface of the base sheet.

The adhesive of the adhesive layer or layers on the first and/or second surfaces of the base sheet may be curable by an external stimulus, such as heat, UV radiation, an electric field and/or a chemical reaction. In this way, the protective sheeting can be easily removed from the wafer after processing. Specifically, the adhesive can be cured by applying the external stimulus to the adhesive layer or layers, thereby lowering the adhesive force of the adhesive and allowing for an easy removal of the protective sheeting. Further, the adhesive material may be, for example, a water soluble resin.

In particular, the adhesive material may be an acrylic resin or an epoxy resin. A preferred example of a UV curable type resin for the adhesive material is, e.g., urethane acrylate oligomer.

There is further provided by the inventor a protective sheeting, such as a protective tape, for use in processing a wafer, the protective sheeting comprising a substantially circular or circular base sheet, a substantially annular or annular adhesive layer applied to a peripheral portion of a first surface of the base sheet and a substantially annular or annular adhesive layer applied to a peripheral portion of a second surface of the base sheet.

The second surface of the base sheet is opposite to the first surface of the base sheet. No adhesive is provided on the first surface of the base sheet inside the inner diameter of the adhesive layer or on the second surface of the base sheet inside the inner diameter of the adhesive layer.

The diameter of the base sheet may be substantially the same as the outer diameter of the adhesive layer on the first surface of the base sheet and/or the second surface of the base sheet. The diameter of the base sheet may be substantially the same as the diameter of a semiconductor-sized wafer.

Such protective sheetings having another substantially annular or annular adhesive layer on the second surface of the base sheet may be comprised in a protective sheeting arrangement with two release liners, as will be further detailed below. In this case, the protective sheetings are attached to the one release liner via the adhesive layer on the first surface of the base sheet and to the other release liner via the adhesive layer on the second surface of the base sheet.

The substantially annular or annular adhesive layer on the second surface of the base sheet allows for the protective sheeting to be attached to a carrier, such as a rigid substrate, for example, a glass or silicon substrate.

The outer diameter of the substantially annular or annular adhesive layer on the second surface of the base sheet may be substantially the same as the diameter, i.e., the outer diameter, of the carrier. The inner diameter of the substantially annular or annular adhesive layer on the second surface of the base sheet may be substantially the same as or larger than the diameter, i.e., the outer diameter, of a device area of a wafer, such as a semiconductor-sized wafer, to which the protective sheeting is attached.

For example, the protective sheeting may be used to attach a semiconductor-sized wafer to a glass or silicon substrate for providing further support to the wafer, e.g., when processing the wafer by grinding, cutting, dicing or the like.

The outer diameter of the substantially annular or annular adhesive layer on the first surface of the base sheet may be substantially the same as the outer diameter of the substantially annular or annular adhesive layer on the second surface of the base sheet. The outer diameter of the substantially annular or annular adhesive layer on the first surface of the base sheet may be larger or smaller than the outer diameter of the substantially annular or annular adhesive layer on the second surface of the base sheet.

The inner diameter of the substantially annular or annular adhesive layer on the first surface of the base sheet may be substantially the same as the inner diameter of the substantially annular or annular adhesive layer on the second surface of the base sheet. The inner diameter of the substantially annular or annular adhesive layer on the first surface of the base sheet may be larger or smaller than the inner diameter of the substantially annular or annular adhesive layer on the second surface of the base sheet.

There is further provided by the inventor a protective sheeting, such as a protective tape, for use in processing a wafer, the protective sheeting comprising a substantially circular or circular base sheet, a substantially annular or annular adhesive layer applied to a peripheral portion of a first surface of the base sheet and another adhesive layer applied to a second surface of the base sheet, wherein the second surface of the base sheet is fully coated with the other adhesive layer.

The second surface of the base sheet is opposite to the first surface of the base sheet. No adhesive is provided on the first surface of the base sheet inside the inner diameter of the adhesive layer.

The diameter of the base sheet may be substantially the same as the outer diameter of the adhesive layer on the first surface of the base sheet and/or the second surface of the base sheet. The diameter of the base sheet may be substantially the same as the diameter of a semiconductor-sized wafer.

Such protective sheetings having a fully coated adhesive layer on the second surface of the base sheet may be comprised in a protective sheeting arrangement with two release liners, as will be further detailed below. In this case, the protective sheetings are attached to the one release liner via the adhesive layer on the first surface of the base sheet and to the other release liner via the adhesive layer on the second surface of the base sheet.

The fully coated adhesive layer on the second surface of the base sheet allows for the protective sheeting to be attached to a carrier, such as a rigid substrate, for example, a glass or silicon substrate.

The diameter, i.e., the outer diameter of the fully coated adhesive layer on the second surface of the base sheet may be substantially the same as the diameter, i.e., the outer diameter, of the carrier.

For example, the protective sheeting may be used to attach a semiconductor-sized wafer to a glass or silicon substrate for providing further support to the wafer, e.g., when processing the wafer by grinding, cutting, dicing or the like.

The outer diameter of the substantially annular or annular adhesive layer on the first surface of the base sheet may be substantially the same as the outer diameter of the fully coated adhesive layer on the second surface of the base sheet. The outer diameter of the substantially annular or annular adhesive layer on the first surface of the base sheet may be larger or smaller than the outer diameter of the fully coated adhesive layer on the second surface of the base sheet.

The inner diameter of the substantially annular or annular adhesive layer on the first surface of the base sheet may be substantially the same as the outer diameter of the fully coated adhesive layer on the second surface of the base sheet. The inner diameter of the substantially annular or annular adhesive layer on the first surface of the base sheet may be larger or smaller than the outer diameter of the fully coated adhesive layer on the second surface of the base sheet.

There is further provided by the inventor a combination of a protective sheeting for use in processing a wafer, such as a protective tape, and a carrier, such as a rigid substrate, for example, a glass or silicon substrate. The protective sheeting comprises a substantially circular or circular base sheet and a substantially annular or annular adhesive layer applied to a peripheral portion of a first surface of the base sheet. The carrier is attached to a second surface of the base sheet via another adhesive layer.

The other adhesive layer may be a substantially annular or annular adhesive layer applied to a peripheral portion of the carrier and/or the second surface of the base sheet. Alternatively, the surface of the carrier attached to the base sheet and/or the second surface of the base sheet may be fully coated with the other adhesive layer.

The second surface of the base sheet is opposite to the first surface of the base sheet. No adhesive is provided on the first surface of the base sheet inside the inner diameter of the adhesive layer.

The diameter of the base sheet may be substantially the same as the outer diameter of the adhesive layer on the first surface of the base sheet and/or the second surface of the base sheet. The diameter of the base sheet may be substantially the same as the diameter of a semiconductor-sized wafer.

The carrier may be a substantially circular or circular carrier. The diameter of the base sheet may be substantially the same as the diameter, i.e., the outer diameter, of the carrier. The outer diameter of the adhesive layer between the carrier and the second surface of the base sheet may be substantially the same as the diameter of the carrier.

The carrier may have a thickness of 2 mm or less, preferably of 1 mm or less.

The carrier may have a substantially annular step portion, such as a substantially annular recessed portion, formed along the outer circumference of the carrier. The other adhesive layer may be at least partially arranged on the substantially annular step portion.

The combination of the protective sheeting and the carrier can be used to hold a wafer, such as a semiconductor-sized wafer, e.g., during processing, such as grinding, cutting, dicing or the like, thereby providing particularly stable support to the wafer.

The adhesive layer on the first surface of the base sheet may be arranged so that it does not extend into a device area on a front side of the wafer. The inner diameter of the adhesive layer on the first surface of the base sheet may be substantially the same as or larger than the outer diameter of the device area of the wafer.

In this way, any damage or contamination of the devices formed in the device area can be particularly reliably prevented.

The invention further provides a protective sheeting arrangement comprising a release liner and a plurality of the protective sheetings according to the invention. The protective sheetings are attached to the single release liner via the adhesive layer on the first surface of the base sheet.

In this way, a plurality of the protective sheetings can be stored and transported in a particularly efficient manner.

More than 100 protective sheetings, preferably more than 200 protective sheetings, more preferably more than 300 protective sheetings and even more preferably more than 400 protective sheetings may be attached to the release liner.

The release liner having the plurality of protective sheetings attached thereto may be provided as a roll, i.e., in a rolled up form.

As required, a single protective sheeting may be peeled off from the release liner and used for semiconductor wafer processing.

As has been detailed above, in the protective sheeting of the invention, an additional substantially annular or annular adhesive layer may be applied to the peripheral portion of the second surface of the base sheet, opposite to the first surface. Alternatively, the second surface of the base sheet opposite to the first surface of the base sheet may be fully coated with another adhesive layer. The protective sheeting arrangement of the invention may comprise a plurality of such protective sheetings.

In this case, the protective sheeting arrangement comprises an additional release liner. The protective sheetings are attached to the one release liner via the adhesive layer on the first surface of the base sheet and to the other release liner via the adhesive layer on the second surface of the base sheet.

Moreover, the invention provides a handling system for a semiconductor-sized wafer comprising a semiconductor-sized annular frame and the protective sheeting according to the invention. The protective sheeting is attached to the annular frame via the adhesive layer on the first surface of the base sheet so that a central opening of the annular frame is closed by the protective sheeting.

The protective sheeting is attached to the annular frame so that an outer peripheral portion of the adhesive layer adheres to an inner peripheral portion of the annular frame.

The handling system according to the invention provides the advantageous effects already described above for the protective sheeting of the invention.

Moreover, the invention provides a semiconductor-sized wafer processing method using the protective sheeting of the invention. The semiconductor-sized wafer processing method comprises the steps of attaching the protective sheeting of the invention to a front side or a back side of the semiconductor-sized wafer via the adhesive layer on the first surface of the base sheet so that an inner peripheral portion of the adhesive layer adheres to an outer peripheral portion of the front side or the back side of the wafer, and processing the wafer after the protective sheeting has been attached to the front side or the back side thereof.

The semiconductor-sized wafer processing method provides the advantageous effects already described in detail above for the protective sheeting of the invention.

The step of processing the wafer may be performed on the side of the wafer to which the protective sheeting has not been attached. For example, the protective sheeting may be attached to the front side of the wafer and processing, such as grinding, cutting, dicing, polishing or the like, may be performed on the back side of the wafer.

The step of processing the wafer may be performed on the side of the wafer to which the protective sheeting has been attached. For example, the protective sheeting may be attached to the front side of the wafer and a processing step, such as an edge trimming step, may be performed on the front side of the wafer. In this case, at least a part of the outer peripheral portion of the front side of the wafer may be cut through the protective sheeting, so as to obtain a substantially annular or annular step portion along the outer circumference of the wafer.

The semiconductor-sized wafer processing method may further comprise the step of attaching the protective sheeting to an annular frame via the adhesive layer on the first surface of the base sheet so that a central opening of the annular frame is closed by the protective sheeting. The protective sheeting may be attached to the annular frame so that an outer peripheral portion of the adhesive layer adheres to an inner peripheral portion of the annular frame. The step of attaching the protective sheeting to the annular frame may be performed before or after the step of attaching the protective sheeting to the front or back side of the wafer.

The step of processing the wafer may comprise grinding and/or cutting and/or dicing and/or polishing and/or inspecting and/or edge trimming the wafer. The step of cutting the wafer may be carried out by using a cutting apparatus with a cutting blade, such as a rotating knife blade, or by using a laser processing apparatus for applying a laser beam to the wafer. The laser beam may be used to cut grooves into the wafer by laser ablation or to form modified layers inside the wafer, as will be further detailed below.

The semiconductor-sized wafer processing method may be carried out using the protective sheeting which has another substantially annular adhesive layer or a fully coated adhesive layer applied to the peripheral portion of the second surface of the base sheet. In this case, the semiconductor-sized wafer processing method may further comprise the step of attaching the protective sheeting to a carrier, such as a rigid substrate, e.g., a glass or silicon substrate, via the adhesive layer on the second surface of the base sheet.

According to an embodiment of the semiconductor-sized wafer processing method of the invention, the protective sheeting may be attached to the front side of the wafer and the back side of the wafer may be ground so as to reduce the thickness of the wafer, e.g., to a predetermined thickness.

The semiconductor-sized wafer processing method may further comprise the steps of applying a laser beam to the wafer from the back side thereof after the grinding step, so as to form a plurality of modified layers within the wafer, and dividing the wafer along the modified layers.

The term "modified layer" defines a region different from its surrounding or ambient region in density and/or refractive index and/or mechanical strength and/or any other physical property in the wafer due to the application of the laser beam, causing a reduction in strength of the modified layer as compared to the surrounding or ambient region. Examples of modified layers include a melted and rehardened region, a cracked region, a breakdown region and a region with a changed refractive index. Further, combinations of these regions may be present in the modified layers.

The modified layers may be formed along the intersecting or crossing division lines of the wafer. Since the modified layers exhibit a reduced strength, the wafer can be easily divided along these layers, i.e., along the division lines, in the subsequent dividing step by applying an external force to the wafer. The external force may be applied to the wafer by expanding the protective sheeting in a radial direction, e.g., by use of an expansion drum, or by attaching another protective tape or sheeting to the wafer and expanding this other tape or sheeting in a radial direction, e.g., by use of an expansion drum.

In this way, a plurality of separated individual device chips is obtained. In a further subsequent step, these individual chips may be picked up from the protective sheeting, e.g., using a pick-up device with a collet.

The semiconductor-sized wafer processing method may further comprise a step of removing, e.g., peeling off, the protective sheeting from the semiconductor wafer. This step may be carried out, e.g., after processing and before dividing the wafer.

If the adhesive layer on the first surface of the base sheet is curable by an external stimulus, such as heat, UV radiation, an electric field and/or a chemical reaction, removal of the protective sheeting from the wafer can be facilitated by applying the external stimulus to the adhesive layer, thereby lowering the adhesive force of the adhesive.

BRIEF DESCRIPTION OF THE DRAWINGS

Hereinafter, non-limiting examples of the invention are explained with reference to the drawings, in which:

FIGS. 6(a) to (c) are schematic cross-sectional views of different embodiments of protective sheeting arrangements of the present invention, wherein FIG. 6(a) shows a first embodiment of the protective sheeting arrangement as shown in FIG. 5, FIG. 6(b) shows a second embodiment of the protective sheeting arrangement, having protective sheetings with two annular adhesive layers, and FIG. 6(c) shows a third embodiment of the protective sheeting arrangement, having protective sheetings with an annular adhesive layer and a fully coated adhesive layer;

DETAILED DESCRIPTION OF CURRENTLY PREFERRED EMBODIMENTS

Figure 1:
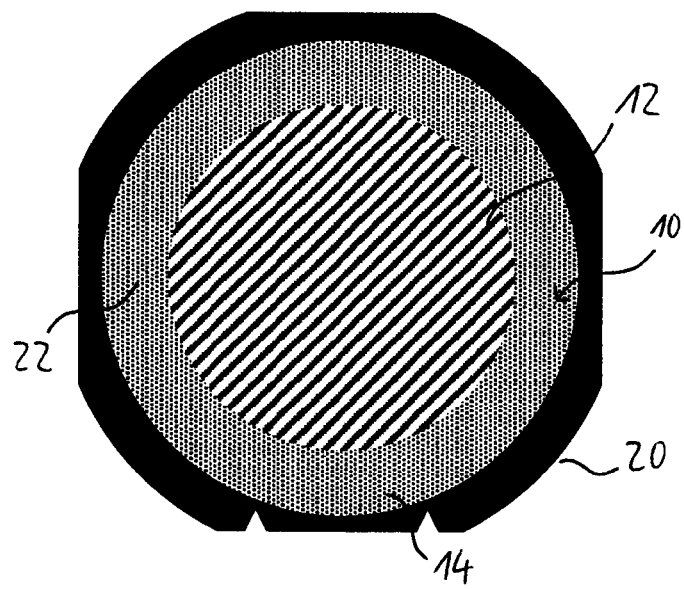
FIG. 1 is a schematic plan view of an embodiment of the protective sheeting of the present invention attached to an annular frame.

FIG. 1 shows a schematic plan view of a protective sheeting 10 according to an embodiment of the present invention, wherein the protective sheeting 10 is attached to an annular frame 20.

The protective sheeting 10 comprises a circular base sheet 12 and an annular adhesive layer 14 applied to a peripheral portion of a first surface of the base sheet 12. The protective sheeting 10 is attached to the annular frame 20 via the adhesive layer 14 so that a central opening 22 of the annular frame 20 is closed by the protective sheeting 10.

Figure 2:
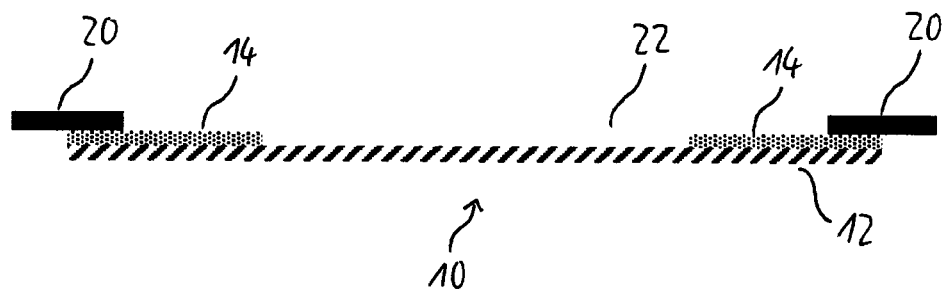
FIG. 2 is a schematic cross-sectional view of the protective sheeting and the annular frame shown in FIG. 1.

As is shown in FIG. 2, the outer diameter of the adhesive layer 14 is larger than the inner diameter of the annular frame 20. The protective sheeting 10 is attached to the annular frame 20 so that an outer peripheral portion of the adhesive layer 14 adheres to an inner peripheral portion of the annular frame 20. As is further shown in FIG. 2, no adhesive is provided on the first surface of the base sheet 12 inside the inner diameter of the adhesive layer 14. The diameter of the base sheet 12 is the same as the outer diameter of the adhesive layer 14.

The base sheet 12 has a thickness in the range of 20 to 300 μm and the adhesive layer 14 has a thickness in the range of 5 to 200 μm.

The base sheet 12 is made of polyvinyl chloride and the adhesive layer 14 is made of a UV curable type resin, such as urethane acrylate oligomer.

The combination of the protective sheeting 10 and the annular frame 20 shown in FIGS. 1 and 2 forms a handling system for a semiconductor wafer according to an embodiment of the invention.

Figure 3:
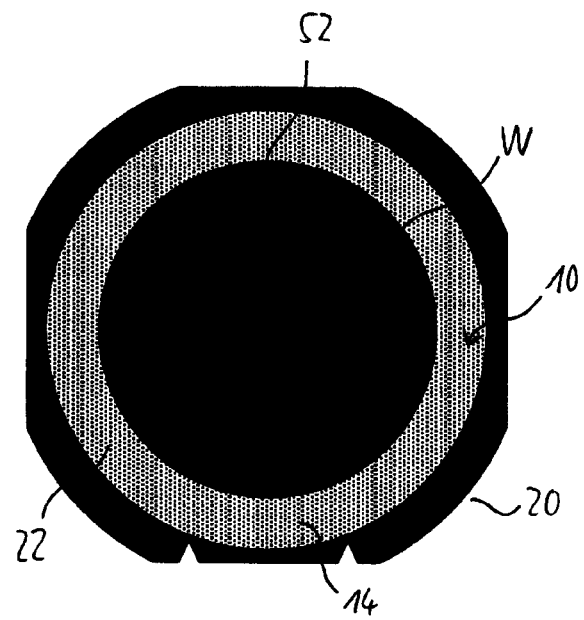
FIG. 3 is a schematic plan view of the protective sheeting and the annular frame shown in FIG. 1 with a semiconductor wafer attached to the protective sheeting.
Figure 4:
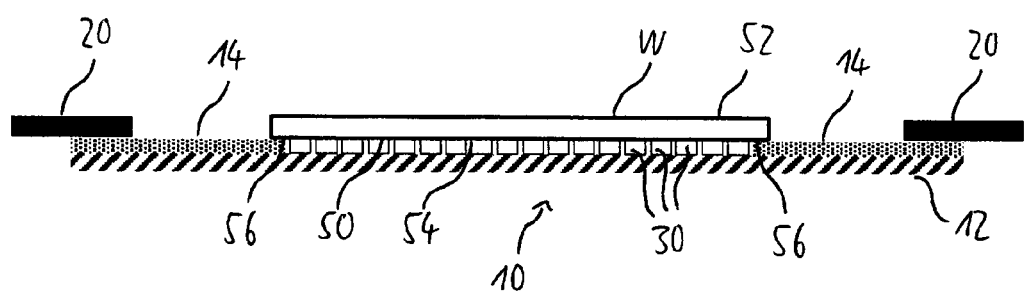
FIG. 4 is a schematic cross-sectional view of the protective sheeting, the annular frame and the semiconductor wafer shown in FIG. 3.

FIGS. 3 and 4 are a schematic plan view and a schematic cross-sectional view, respectively, showing the handling system of FIGS. 1 and 2 with a wafer W attached thereto. In the embodiment of the invention shown in FIGS. 3 and 4, the wafer W is a semiconductor wafer, such as a Si wafer.

As is schematically shown in FIG. 4, the semiconductor wafer W has a front side 50 and a back side 52. On the front side 50 of the wafer W, a plurality of devices 30, such as ICs, LSIs or MEMS, are formed. The devices 30 are formed in separate regions which are partitioned by crossing division lines arranged on the front side 50 of the semiconductor wafer W in a lattice or grid pattern. In particular, the devices 30 are formed in a device area 54 of the wafer W.

The device area 54 of the wafer W is surrounded by an annular peripheral marginal area or edge exclusion 56, in which no devices are formed.

As is shown in FIG. 4, the adhesive layer 14 does not extend into the device area 54 of the wafer W. The inner diameter of the adhesive layer 14 is smaller than the diameter of the semiconductor wafer W but larger than the diameter of the device area 54 of the wafer W. Thus, any damage or contamination of the devices 30 due to the adhesive layer 14 can be reliably prevented.

Moreover, as is also schematically shown in FIG. 4, the thickness of the adhesive layer 14 is substantially the same as the height of the devices 30 formed in the device area 54 of the wafer W. Hence, when attaching the protective sheeting 10 to the front side 50 of the wafer W via the adhesive layer 14 so that the inner peripheral portion of the adhesive layer 14 adheres to the outer peripheral portion of the front side 50, i.e., the peripheral marginal area or edge exclusion 56, of the semiconductor wafer W, the devices 30 are not pressed by the base sheet 12. Therefore, also any damage to the devices 30 caused by the base sheet 12 is reliably avoided.

Once the semiconductor wafer W has been attached to the protective sheeting 10, as shown in FIGS. 3 and 4, it may be subjected to one or more processing steps, such as grinding, polishing, dicing and/or cutting, as will be explained in detail below with reference to FIGS. 7(a) to (d).

Figure 5:
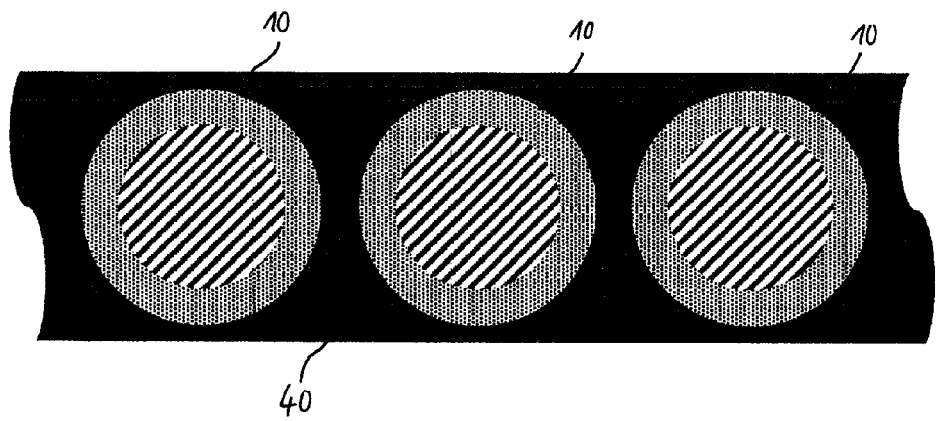
FIG. 5 is a schematic plan view of an embodiment of the protective sheeting arrangement of the invention.
Figure 6:
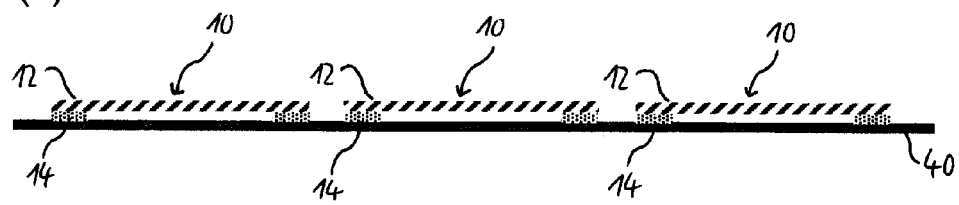
Figure 6:
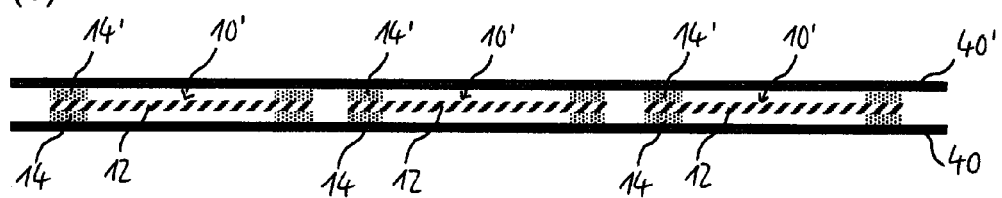
Figure 6:
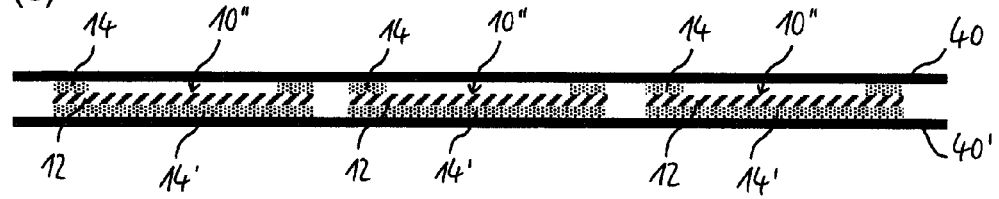

FIGS. 5 and 6 show a schematic plan view and schematic cross-sectional views, respectively, of protective sheeting arrangements according to embodiments of the present invention.

The protective sheeting arrangement according to a first embodiment schematically shown in FIGS. 5 and 6(a) comprises a release liner 40 and a plurality of protective sheetings 10 as shown in FIGS. 1 to 4. The protective sheetings 10 are attached to the release liner 40 via the adhesive layers 14, as is shown in FIG. 6(a).

The release liner 40 may be made of any suitable plastic material, such as polyvinyl chloride, polyolefin, polyethylene terephthalate or the like.

The release liner 40 is provided in the form of an elongate web or sheet, on which the protective sheetings 10 are arranged one next to the other. Although in FIGS. 5 and 6(a) to (c), three protective sheetings 10 are schematically shown, more than 100, more than 200, more than 300 or more than 400 protective sheetings 10 may be provided on the release liner 40. The release liner 40 with the protective sheetings 10 attached thereto may be rolled up and stored in the form of a roll, thereby saving storage space and facilitating transport of the protective sheeting arrangement.

A single protective sheeting 10 may be peeled off from the release liner 40 and used for processing a wafer, such as a semiconductor wafer, as required.

A protective sheeting arrangement according to a second embodiment is schematically shown in FIG. 6(b). The protective sheeting arrangement according to the second embodiment differs from the protective sheeting arrangement according to the first embodiment in that it comprises a plurality of protective sheetings 10' and an additional release liner 40'. In these protective sheetings 10', an additional annular adhesive layer 14' is applied to the peripheral portion of the second surface of the base sheet 12, opposite to the first surface. The inner and outer diameters of the adhesive layer 14' on the second surface of the base sheet 12 are the same as those of the adhesive layer 14 on the first surface of the base sheet 12.

The protective sheetings 10' are attached to the one release liner 40 via the adhesive layer 14 on the first surface of the base sheet 12 and to the other release liner 40' via the adhesive layer 14' on the second surface of the base sheet 12.

A single protective sheeting 10' may be peeled off from the release liners 40 and 40' and used for processing a wafer, such as a semiconductor wafer, as required.

A protective sheeting arrangement according to a third embodiment is schematically shown in FIG. 6(c). The protective sheeting arrangement according to the third embodiment differs from the protective sheeting arrangement according to the second embodiment in that it comprises a plurality of protective sheetings 10". In these protective sheetings 10", the second surface of the base sheet 12 opposite to the first surface of the base sheet 12 is fully coated with another adhesive layer 14'.

The protective sheetings 10" are attached to the one release liner 40 via the adhesive layer 14 on the first surface of the base sheet 12 and to the other release liner 40' via the adhesive layer 14' on the second surface of the base sheet 12.

A single protective sheeting 10" may be peeled off from the release liners 40 and 40' and used for processing a wafer, such as a semiconductor wafer, as required.

As has been indicated above, the semiconductor wafer W attached to the annular frame 20 via the protective sheeting 10, as shown in FIGS. 3 and 4, may be subjected to a processing step, such as a grinding step and/or a cutting step. In particular, the back side 52 of the wafer W may be ground in order to reduce the thickness of the wafer W to a predetermined thickness. This grinding step may be performed in the manner described in U.S. Pat. No. 8,815,644 B2.

In particular, grinding of the back side 52 of the semiconductor wafer W may be performed using a grinding apparatus (not shown). The grinding apparatus may comprise a spindle housing, a spindle rotatably accommodated in the spindle housing and a grinding wheel mounted to the lower end of the spindle. A plurality of abrasive members may be fixed to the lower surface of the grinding wheel, wherein each abrasive member may be formed from a diamond abrasive member configured by fixing diamond abrasive grains with a bond, such as a metal bond or a resin bond. The grinding wheel having the abrasive members is rotated at high speeds by driving the spindle.

In the grinding step, the semiconductor wafer arrangement shown in FIGS. 3 and 4 is held by a chuck table (not shown). Both the chuck table and the grinding wheel of the grinding apparatus are rotated and the grinding wheel is lowered so as to bring the abrasive members into contact with the back side 52 of the semiconductor wafer W, thereby grinding the back side 52.

Figure 7:
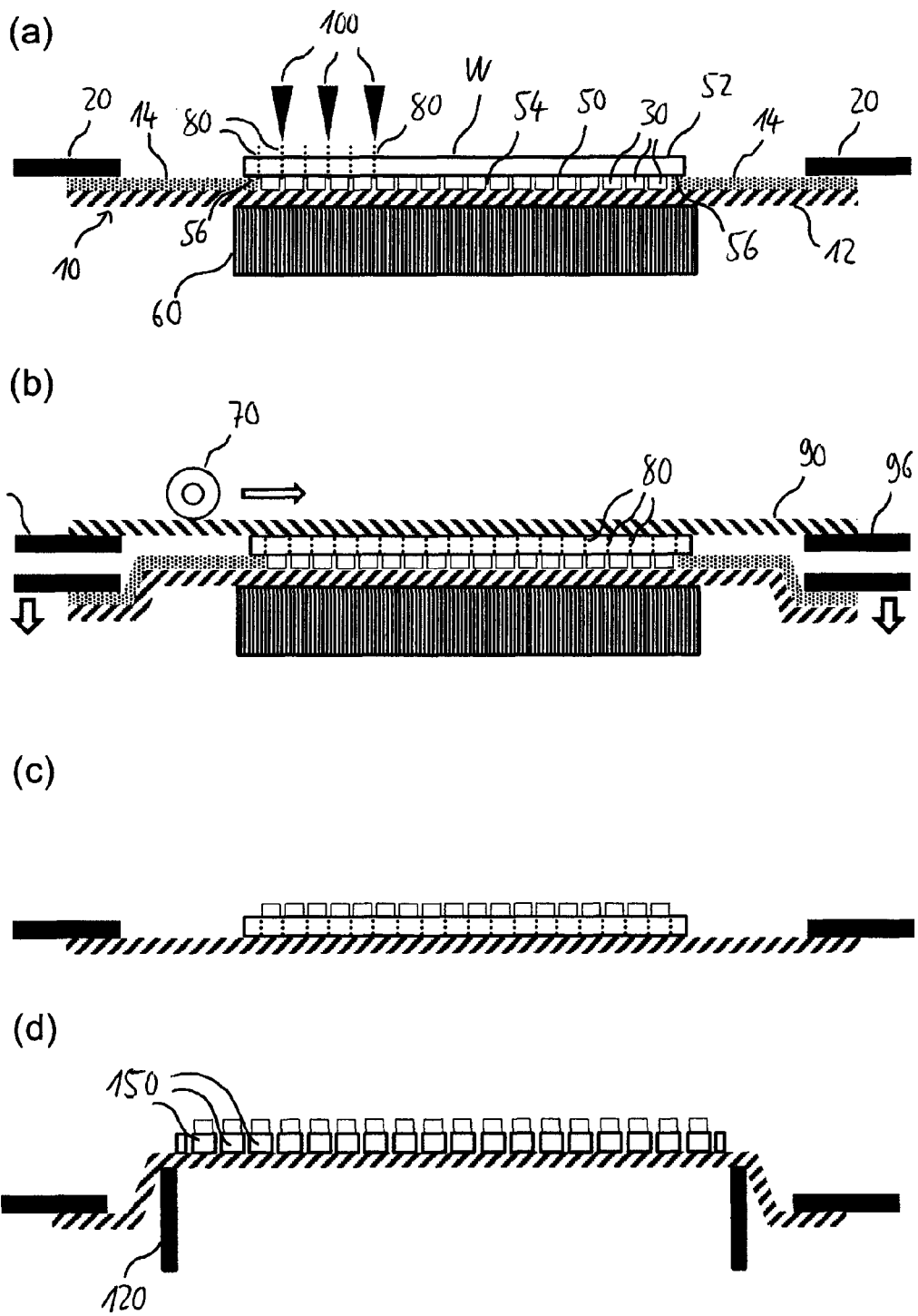
FIGS. 7(a) to (d) are schematic cross-sectional views illustrating a semiconductor wafer processing method according to an embodiment of the present invention.

After the back side 52 of the wafer W has been ground, the wafer W is subjected to a modified layer forming step. As is schematically shown in FIG. 7(a), for this step, the same arrangement of the semiconductor wafer W, the protective sheeting 10 and the annular frame 20 can be used as for the grinding step. No rearrangement of the wafer W or replacement of the protective sheeting 10 and/or the annular frame 20 is necessary, thus greatly simplifying the processing operation.

The modified layer forming step may be performed in the manner described in U.S. Pat. No. 8,815,644 B2.

In the modified layer forming step, a laser processing apparatus (not shown) is used to apply a laser beam 100 to the semiconductor wafer W from the back side 52 thereof, while the wafer W is held on a chuck table 60 via the protective sheeting 10 (see FIG. 7(a)). The laser beam 100 has a transmission wavelength to the wafer W, i.e., a wavelength which is transmitted through the wafer W, and the focal point of the laser beam 100 is set inside the wafer W. By this application of the laser beam 100, a modified layer 80 is formed inside the wafer W in the region of the focal point of the laser beam 100. The focal point of the laser beam 100 and the semiconductor wafer W are moved relative to each other along the division lines of the wafer W, so as to form modified layers 80 inside the wafer W along all of the division lines. These modified layers 80 serve as division starting points in the subsequent division of the wafer W into a plurality of device chips.

The subsequent step of dividing the semiconductor wafer W along the modified layers 80 formed inside the wafer W is illustrated in FIGS. 7(b) to (d).

Specifically, as is shown in FIG. 7(b), once the modified layers 80 have been formed along all of the division lines, the back side 52 of the semiconductor wafer W is attached to a dividing tape 90 which is held on an annular frame 96. Specifically, this step is performed by pressing the dividing tape 90 to the back side 52 of the semiconductor wafer W by means of a roller 70 and moving the roller 70 over the back side 52 of the wafer W (as is indicated by the horizontal arrow in FIG. 7(b)), while clamping down the annular frame 20 (as is indicated by the vertical arrows in FIG. 7(b)). Alternatively, the back side 52 of the semiconductor wafer W may be attached to the dividing tape 90 in a vacuum environment, e.g., using a vacuum mounter (not shown).

Then, the protective sheeting 10 is peeled off from the front side 50 of the semiconductor wafer W. This step is facilitated by applying UV radiation to the UV curable type resin of the adhesive layer 14 through the chuck table 60, thereby curing the resin and lowering its adhesive force. The chuck table 60 may be configured so as to transmit UV radiation only in the region corresponding to the adhesive layer 14. A mask (not shown) may be used to avoid unintentional UV curing of an adhesive layer on the dividing tape 90.

Since the adhesive layer 14 of the protective sheeting 10 does not adhere to the device area 54 of the wafer W, but only to the peripheral marginal area or edge exclusion 56 thereof, there is no risk that the devices 30 may be damaged or contaminated in the removal process of the protective sheeting 10.

The annular frame 96 holding the semiconductor wafer W via the dividing tape 90 is fixed in its position, e.g., by clamps (not shown). Subsequently, an expansion drum 120 (see FIG. 7(d)) is raised relative to the annular frame 96, thereby expanding the dividing tape 90 and thus applying an external force to the modified layers 80 formed inside the wafer W. Hence, the wafer W is divided along the modified layers 80, which serve as division starting points, to obtain a plurality of individual device chips 150.

After dividing the semiconductor wafer W in this way, the dividing tape 90 may be further expanded, e.g., by means of the expansion drum 120, to increase the distance between the device chips 150, thus facilitating the process of picking up each device chip 150 from the dividing tape 90. In particular, each device chip 150 may be peeled off from the dividing tape 90 and picked up under suction by using a pick-up collet (not shown).

Figure 8:
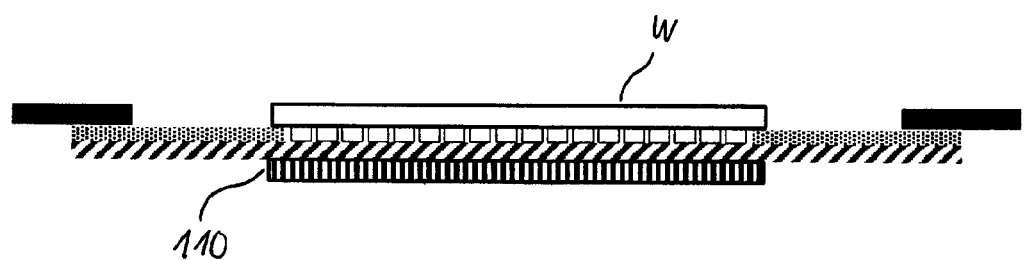
FIG. 8 is a schematic cross-sectional view of the protective sheeting, the annular frame and the semiconductor wafer shown in FIGS. 3 and 4, further comprising a carrier attached to the protective sheeting.

In a further embodiment, the semiconductor-sized wafer handling system of the present invention may comprise a carrier 110 in addition to the protective sheeting 10 and the annular frame 20, as is schematically shown in FIG. 8. The wafer handling system shown in FIG. 8 differs from that shown in FIGS. 3 and 4 only in the presence of the carrier 110. Hence, a detailed description of the other elements of this system is omitted.

The carrier 110 is attached to the second surface of the base sheet 12 of the protective sheeting 10 via another adhesive layer (not shown). The other adhesive layer may be a substantially annular or annular adhesive layer applied to a peripheral portion of the carrier 110.

In one embodiment, the surface of the carrier 110 which is attached to the base sheet 12 is a flat or even surface without any recesses and the other substantially annular or annular adhesive layer is applied to a peripheral portion of this flat or even surface. In this arrangement, the adhesive layer preferably has a thickness of 20 µm or less. In another embodiment, the carrier 110 has an annular step portion, i.e., an annular recessed portion, formed along its outer circumference. In this case, the other substantially annular or annular adhesive layer is arranged on the annular step portion.

Alternatively, the surface of the carrier 110 attached to the base sheet 12 may be fully coated with the other adhesive layer. In this arrangement, the adhesive layer preferably has a thickness of 20 µm or less.

The carrier 110 is a rigid substrate, such as a glass or silicon substrate. The carrier 110 has a circular shape with a diameter which is substantially the same as that of the wafer W. The thickness of the carrier 110 is approximately 1 mm.

The wafer processing method schematically shown in FIGS. 7(a) to (d) and described in detail above for the handling system shown in FIGS. 3 and 4 can be carried out in substantially the same manner on the handling system shown in FIG. 8. In this case, the carrier 110 is arranged on the chuck table in the grinding and modified layer forming steps. When performing these processing steps, the carrier 110 provides additional support to the wafer W, thus particularly reliably preventing any damage to the devices 30 during processing of the wafer W.

Figure 9:
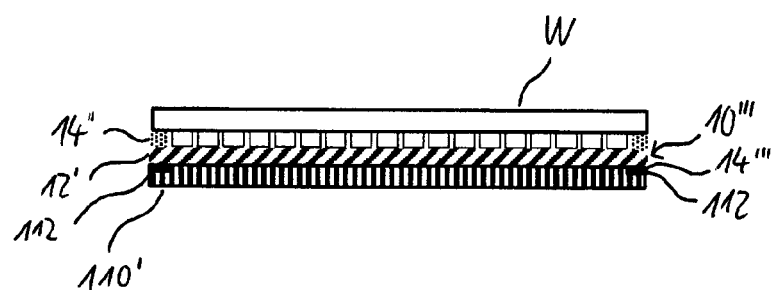
FIG. 9 is a schematic cross-sectional view of another embodiment of an arrangement of a protective sheeting, a carrier and a wafer.

A further arrangement of a protective sheeting 10''', a carrier 110' and the wafer W is schematically shown in FIG. 9. The protective sheeting 10''' of this arrangement differs from the protective sheeting 10 described above in that the diameter of the base sheet 12' and the outer diameter of the adhesive layer 14'' are substantially the same as the diameter of the wafer W. The carrier 110' differs from the carrier 110 described above in that it has an annular step portion 112, i.e., an annular recessed portion, formed along its outer circumference. An additional annular adhesive layer 14''' is arranged on the annular step portion 112. The protective sheeting 10''' is attached to the carrier 110' via the annular adhesive layer 14'''.

Alternatively, the surface of the carrier 110' attached to the base sheet 12' may be a flat or even surface without any recesses and the additional annular adhesive layer 14''' may be applied to a peripheral portion of this flat or even surface. In this arrangement, the adhesive layer 14''' preferably has a thickness of 20 µm or less.

In another embodiment, the surface of the carrier 110' attached to the base sheet 12' may be fully coated with the other adhesive layer 14'''. In this arrangement, the adhesive layer 14''' preferably has a thickness of 20 µm or less.

The adhesive layer 14'' and the adhesive layer 14''' are made of a UV curable type resin, such as urethane acrylate oligomer.

A wafer processing method similar to that schematically shown in FIGS. 7(a) to (d) can be carried out on the arrangement shown in FIG. 9, as will be explained in detail in the following with reference to FIGS. 10(a) to (d) and 11(a) to (c).

First, the back side 52 of the wafer W is ground in order to reduce the thickness of the wafer W to a predetermined thickness. In particular, grinding of the back side 52 of the semiconductor wafer W may be performed using a grinding apparatus (not shown) as described above. In the grinding step, the semiconductor wafer arrangement shown in FIG. 9 is held by a chuck table (not shown), wherein the carrier 110' is arranged on the chuck table. Both the chuck table and the grinding wheel of the grinding apparatus are rotated and the grinding wheel is lowered so as to bring the abrasive members into contact with the back side 52 of the semiconductor wafer W, thereby grinding the back side 52.

After the back side 52 of the wafer W has been ground, the wafer W is subjected to a modified layer forming step. As is schematically shown in FIG. 10(a), for this step, the same arrangement of the semiconductor wafer W, the protective sheeting 10''' and the carrier 110' can be used as for the grinding step.

In the modified layer forming step, a laser processing apparatus (not shown) is used to apply a laser beam 100 to the semiconductor wafer W from the back side 52 thereof, while the wafer W is held on a chuck table 60 via the protective sheeting 10''' and the carrier 110' (see FIG. 10(a)). The carrier 110' may be held on the chuck table 60 under suction. The laser beam 100 has a transmission wavelength to the wafer W, i.e., a wavelength which is transmitted through the wafer W, and the focal point of the laser beam 100 is set inside the wafer W. By this application of the laser beam 100, modified layers 80 are formed inside the wafer W along all of the division lines in the manner described in detail above. The modified layers 80 serve as division starting points in the subsequent division of the wafer W into a plurality of device chips.

The subsequent steps for dividing the semiconductor wafer W along the modified layers 80 formed inside the wafer W are illustrated in FIGS. 10(b) to 11(c).

Specifically, as is shown in FIG. 10(b), once the modified layers 80 have been formed along all of the division lines, the back side 52 of the semiconductor wafer W is attached to a dividing tape 90 which is held on an annular frame 96. Specifically, this step is performed by pressing the dividing tape 90 to the back side 52 of the semiconductor wafer W by means of a roller 70 and moving the roller 70 over the back side 52 of the wafer W (as is indicated by the horizontal arrow in FIG. 10(b)). Alternatively, the back side 52 of the semiconductor wafer W may be attached to the dividing tape 90 in a vacuum environment, e.g., using a vacuum mounter (not shown).

Then, the carrier 110' is removed from the protective sheeting 10'''. This step is facilitated by applying UV radiation (vertical arrows in FIG. 10(c)) to the UV curable type resin of the adhesive layer 14''' from the back side of the carrier 110', as is schematically shown in FIG. 10(c). Subsequently, the carrier 110' is lifted from the protective sheeting 10''', as is schematically shown by the vertical arrow in FIG. 10(d), and removed.

In a subsequent step, the protective sheeting 10''' is removed from the wafer W. This step may be facilitated by applying UV radiation (vertical arrows in FIG. 11(a)) to the UV curable type resin of the adhesive layer 14'' from the second surface of the base sheet 12', if necessary, as is schematically shown in FIG. 11(a). Subsequently, the protective sheeting 10''' is lifted from the wafer W, as is schematically shown by the vertical arrow in FIG. 11(b), and removed. The adhesive layer 14'' may be removed together with the protective sheeting 10''' or remain on the peripheral marginal area of the wafer W, in which no devices are formed.

Subsequently, the wafer W is divided in the same manner as shown in FIG. 7(d) and described in detail above. Specifically, the annular frame 96 holding the semiconductor wafer W via the dividing tape 90 is fixed in its position, e.g., by clamps (not shown). Then, the expansion drum 120 (see FIG. 11(c)) is raised relative to the annular frame 96, thereby expanding the dividing tape 90 and thus applying an external force to the modified layers 80 formed inside the wafer W. Hence, the wafer W is divided along the modified layers 80, which serve as division starting points, to obtain a plurality of individual device chips 150.

After dividing the semiconductor wafer W in this way, the dividing tape 90 may be further expanded, e.g., by means of the expansion drum 120, to increase the distance between the device chips 150, thus facilitating the process of picking up each device chip 150 from the dividing tape 90. In particular, each device chip 150 may be peeled off from the dividing tape 90 and picked up under suction by using a pick-up collet (not shown).

The use of the protective sheetings 10 and 10''' for processing the semiconductor wafer W has been discussed in detail above with reference to FIGS. 7(a) to (d), 10(a) to (d) and 11(a) to (c) for the example of grinding and modified layer forming processes. However, the protective sheeting of the present invention may be used for a variety of other processing methods, as will be further detailed in the following.

Figure 10:
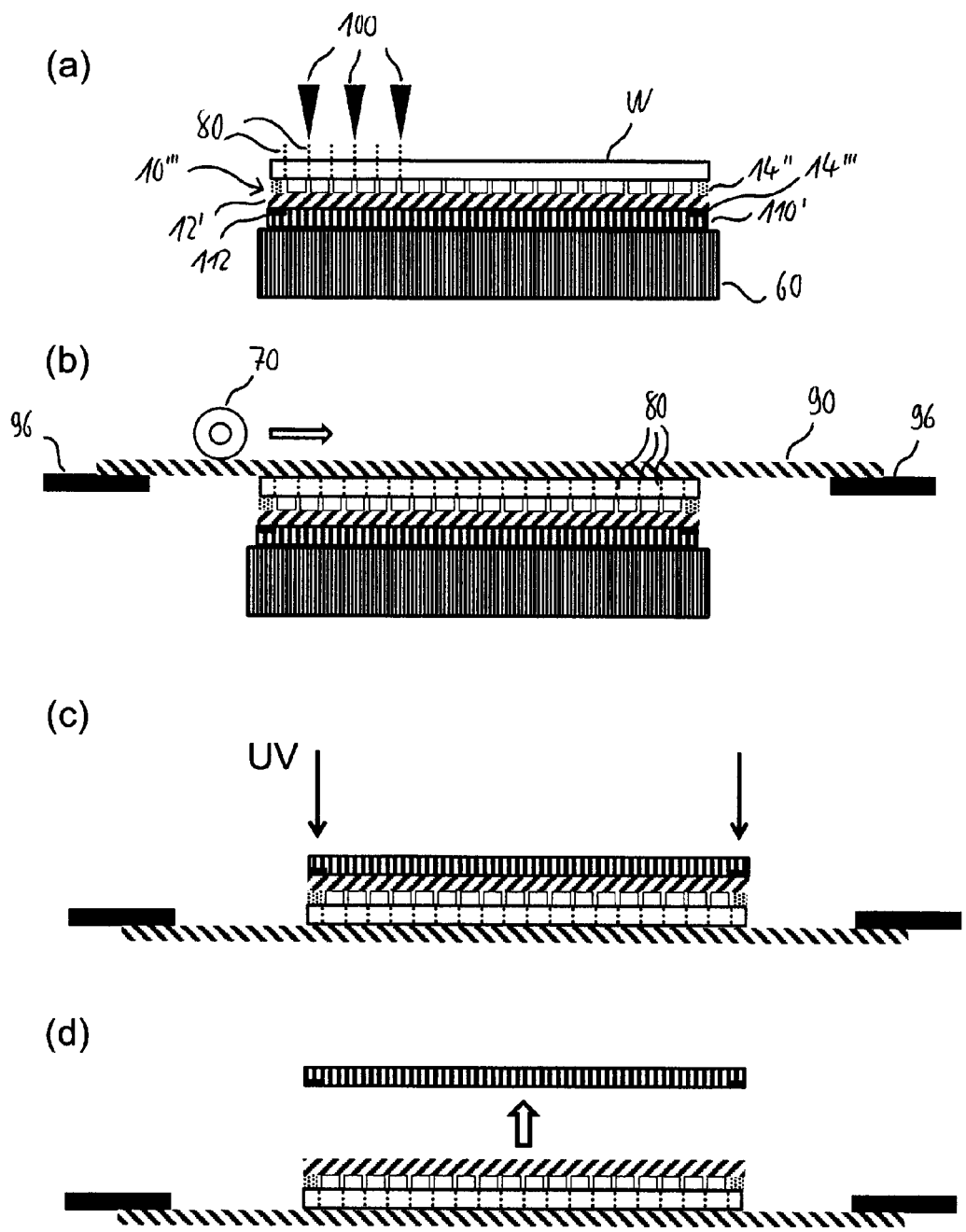
FIGS. 10(a) to (d) are schematic cross-sectional views illustrating a semiconductor wafer processing method according to an embodiment of the present invention.
Figure 11:
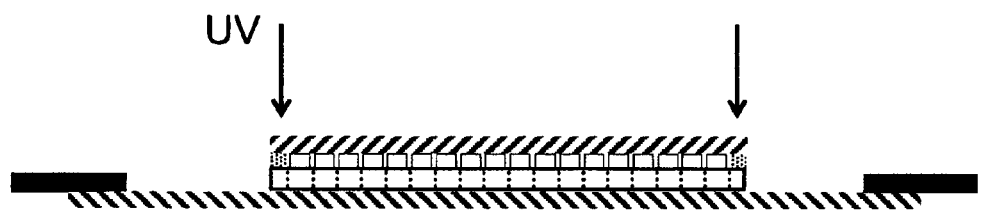
FIGS. 11(a) to (c) are schematic cross-sectional views illustrating a semiconductor wafer processing method according to an embodiment of the present invention.
Figure 11:
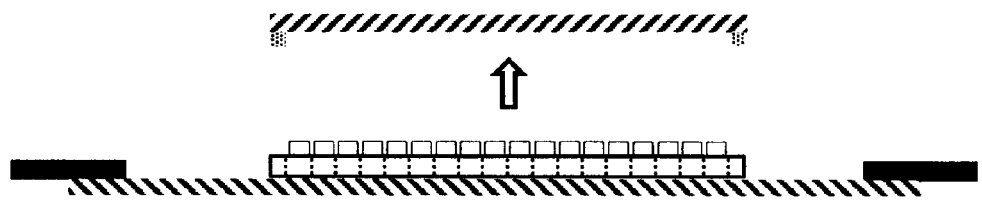
Figure 11:
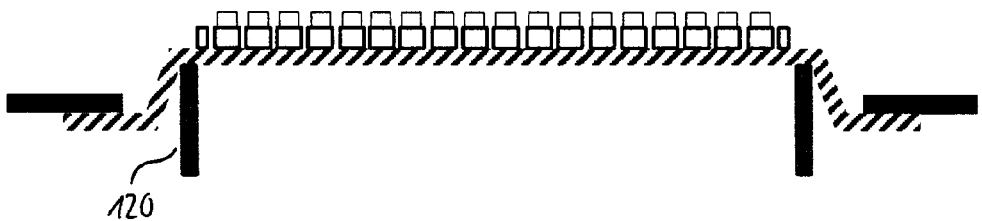

For example, the protective sheeting may be employed in a processing operation where the wafer is cut by using a cutting apparatus (not shown), employing a rotating cutting blade, such as a knife blade, or by using a laser processing apparatus (not shown) for cutting grooves into the wafer by laser ablation. Such cutting processing can be performed substantially with the same arrangements as shown in FIGS. 7(a) and 10(a). In particular, in these arrangements, the wafer may be fully or partially cut from the back side thereof using the cutting apparatus or the laser processing apparatus. Subsequently, the further steps shown in FIG. 7(b) to (d) or FIGS. 10(b) to 11(c) may be carried out, in order to allow for the resulting individual device chips to be picked up in a simple and reliable manner.

Further, for example, the protective sheeting may be attached to the front side of the wafer and a processing step, such as an edge trimming step, may be performed on the front side of the wafer. In this case, at least a part of the outer peripheral portion of the front side of the wafer may be cut through the protective sheeting, so as to obtain a substantially annular or annular step portion along the outer circumference of the wafer.

The wafer processing method may be carried out using the protective sheeting which has another substantially annular adhesive layer or a fully coated adhesive layer applied to the peripheral portion of the second surface of the base sheet. In this case, the wafer processing method may further comprise the step of attaching the protective sheeting to a carrier, such as a rigid substrate, e.g., a glass or silicon substrate, via the adhesive layer on the second surface of the base sheet, so as to provide further support to the wafer.

The protective sheeting according to the present invention may also be used, for example, for an optical inspection process, in which a surface of a wafer is inspected for flaws or damages, such as grinding or cutting marks. In this case, the protective sheeting can be attached to a sensitive surface of the wafer, in order to protect this surface from damage or contamination.

In fact, the protective sheeting of the present invention may be used for the protection of any type of sensitive surface of a wafer, providing the advantages of being easily removable and not leaving any adhesive residues on sensitive surface areas, so that no subsequent cleaning of the surface is required. In particular, a protective sheeting with a base sheet made of Kapton may be provided on a sensitive surface of a wafer for protection thereof. Kapton is a heat resistant material. Hence, a protective sheeting with a base sheet made of Kapton may be used particularly advantageously for protecting sensitive wafer surfaces during heating processes, such as heat treatments.

The foregoing embodiments and their variants have been disclosed for illustrative purposes only, and further variation is wholly possible within the capabilities of the skilled reader. Accordingly, the appended claims are intended to cover all modifications, substitutions, alterations, omissions and additions which one skilled in the art could achieve from the foregoing disclosure, taking into account his own general and specialist knowledge and expertise.

The invention claimed is:

1. A protective sheeting for use in processing a semiconductor-sized wafer, the protective sheeting comprising
   a substantially circular base sheet, and
   a substantially annular adhesive layer applied to a peripheral portion of a first surface of the base sheet,
   wherein the inner diameter of the adhesive layer is smaller than the diameter of the semiconductor-sized wafer, and the outer diameter of the adhesive layer is larger than the inner diameter of a semiconductor-sized annular frame for holding the semiconductor-sized wafer.

2. The protective sheeting according to claim 1, wherein the diameter of the base sheet is substantially the same as the outer diameter of the adhesive layer.

3. The protective sheeting according to claim 1, wherein the inner diameter of the adhesive layer is smaller than the diameter of the wafer by 0.5 to 3.5 mm, preferably by 1.0 to 3.0 mm.

4. The protective sheeting according to claim 1, wherein the outer diameter of the adhesive layer is in the range from 105 to 575 mm.

5. The protective sheeting according to claim 1, wherein the inner diameter of the adhesive layer is in the range from 45 to 445 mm.

6. The protective sheeting according to claim 1, wherein the outer diameter of the adhesive layer is larger than the inner diameter of the adhesive layer by 30 to 100 mm, preferably by 40 to 70 mm.

7. The protective sheeting according to claim 1, wherein another substantially annular adhesive layer is applied to a peripheral portion of a second surface of the base sheet.

8. The protective sheeting according to claim 1, wherein a second surface of the base sheet is fully coated with another adhesive layer.

9. The protective sheeting according to claim 1, wherein the adhesive is curable by an external stimulus, such as heat, UV radiation, an electric field and/or a chemical reaction.

10. A protective sheeting arrangement, comprising
a release liner, and
a plurality of the protective sheetings according to any one of the preceding claims,
wherein the protective sheetings are attached to the release liner via the adhesive layer on the first surface of the base sheet.

11. A handling system for a semiconductor-sized wafer, comprising
a semiconductor-sized annular frame, and
the protective sheeting according to claim 1,
wherein the protective sheeting is attached to the annular frame via the adhesive layer on the first surface of the base sheet so that a central opening of the annular frame is closed by the protective sheeting.

12. A semiconductor-sized wafer processing method, comprising the steps of
attaching the protective sheeting according to claim 1 to a front side or a back side of the semiconductor-sized wafer via the adhesive layer on the first surface of the base sheet so that an inner peripheral portion of the adhesive layer adheres to an outer peripheral portion of the front side or the back side of the wafer, and
processing the wafer after the protective sheeting has been attached to the front side or the back side thereof.

13. The semiconductor-sized wafer processing method according to claim 12, wherein the step of processing the wafer is performed on the side of the wafer to which the protective sheeting has not been attached.

14. The semiconductor-sized wafer processing method according to claim 12, wherein the step of processing the wafer is performed on the side of the wafer to which the protective sheeting has been attached.

15. The semiconductor-sized wafer processing method according to claim 12, further comprising the step of attaching the protective sheeting to a semiconductor-sized annular frame via the adhesive layer on the first surface of the base sheet so that a central opening of the annular frame is closed by the protective sheeting.

16. The semiconductor-sized wafer processing method according to claim 12, wherein the step of processing the wafer comprises grinding and/or cutting and/or dicing and/or polishing and/or inspecting and/or edge trimming the wafer.

17. The semiconductor-sized wafer processing method according to claim 12 as dependent on claim 7, further comprising the step of attaching the protective sheeting to a carrier via the adhesive layer on the second surface of the base sheet.

18. The semiconductor-sized wafer processing method according to claim 12, wherein
the protective sheeting is attached to the front side of the wafer, and
the back side of the wafer is ground so as to reduce the thickness of the wafer.

19. The semiconductor-sized wafer processing method according to claim 18, further comprising the steps of
applying a laser beam to the wafer from the back side thereof after the grinding step, so as to form a plurality of modified layers within the wafer, and
dividing the wafer along the modified layers.

20. The semiconductor-sized wafer processing method according to claim 12, wherein
the protective sheeting is attached to the front side of the wafer, and
at least a part of the outer peripheral portion of the front side of the wafer is cut through the protective sheeting, so as to obtain a substantially annular step portion along the outer circumference of the wafer.

* * * * *